United States Patent [19]
Weiss

[11] Patent Number: 5,557,238
[45] Date of Patent: Sep. 17, 1996

[54] DIFFERENTIAL AMPLIFIER WITH COMMON MODE REGULATION

[75] Inventor: Juliette Weiss, Seyssinet-Pariset, France

[73] Assignee: SGS-Thomson Microelectronics S.A., Saint Genis, France

[21] Appl. No.: 427,090

[22] Filed: Apr. 21, 1995

[30] Foreign Application Priority Data

Apr. 29, 1994 [FR] France .................. 94 05501

[51] Int. Cl.$^6$ ................... H03F 3/45
[52] U.S. Cl. ................... 330/258; 330/261
[58] Field of Search ................... 330/252, 257, 330/258, 261, 311

[56] References Cited

U.S. PATENT DOCUMENTS

| | | | |
|---|---|---|---|
| 3,502,999 | 3/1970 | Ronchinsky | 330/30 |
| 4,794,349 | 12/1988 | Senderowicz | 330/253 |
| 5,216,380 | 6/1993 | Carbou | 330/253 |
| 5,428,316 | 6/1995 | Molnar | 330/258 X |

FOREIGN PATENT DOCUMENTS 0286372 6/1987 Japan.

OTHER PUBLICATIONS

French Search Report for French Patent Application No. 94 05501 file Apr. 29, 1994.
IEEE Transactions On Nuclear Science, vol. 37, No. 2, Apr. 1990, New York US, pp. 439–443, T. Zimmermann "A High Speed, Low Noise ASIC Preamplifier For Silicon Strip Detectors".

*Primary Examiner*—Steven Mottola
*Attorney, Agent, or Firm*—David M. Driscoll; James H. Morris

[57] ABSTRACT

An amplifier having differential inputs and outputs that includes: an input differential pair; a first and a second single ended output differential amplifier that each receive the outputs of the differential pair; a buffer stage connected to each single ended output differential amplifier whose output constitutes an output of the amplifier; a unique means for adjusting the quiescent current supplied by the single ended differential amplifiers to the buffer stages that results in the adjustment of the common mode voltage to a required value.

22 Claims, 3 Drawing Sheets

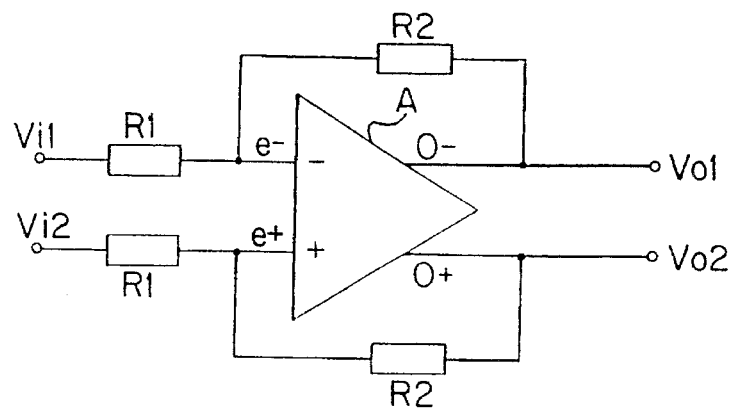
Fig. 1
(PRIOR ART)
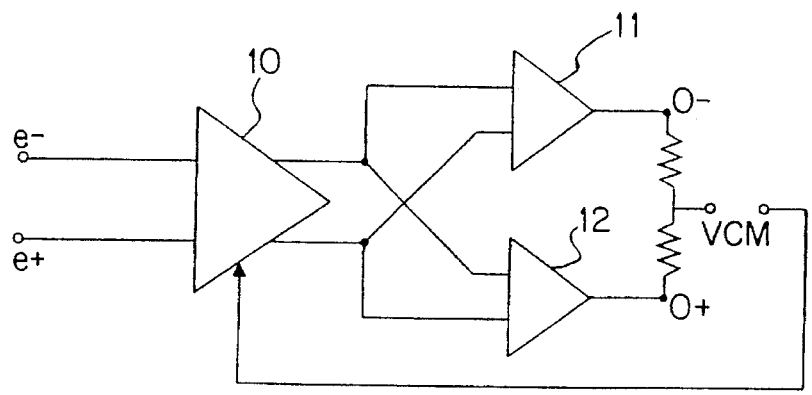
Fig. 2
(PRIOR ART)
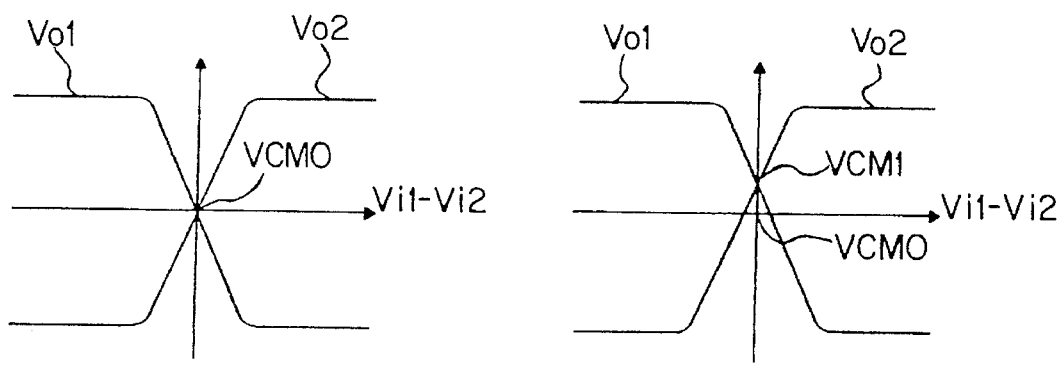
Fig. 3A
(PRIOR ART)
Fig. 3B
(PRIOR ART)

DIFFERENTIAL AMPLIFIER WITH COMMON MODE REGULATION

BACKGROUND OF THE INVENTION

1. Field of the Invention

The present invention concerns the realization of an amplifier that has differential input and outputs, and more particularly, such an amplifier that is required to function at high frequencies.

2. Discussion of the Related Art

FIG. 1 represents a schematic diagram of a known amplifier that has differential inputs and outputs. This amplifier A is provided with inputs e– and e+ and outputs o– and o+. In order for amplifier A to function with a predetermined gain, there is an associated resistance network that comprises a resistance R1 connected in series with each of the inputs of the amplifier and a resistance R2 connected between each input of the amplifier and its corresponding output. Referring to the input voltages as Vi1 and Vi2 and the output voltages as Vo1 and Vo2, the gain of this amplifier is determined by the value of the resistors. Since, Vo1–Vo2=(–R2/R1).(Vi1–Vi2), the differential gain is equal to –R2/R1.

When the input signal varies around an average value, the output signal will vary around the same average value, which is commonly referred to as the common mode voltage VCM. Furthermore, each of the outputs o+ and o– may, because of the very nature of the differential amplifier, reach their respective minimum and maximum determined values which are close to the high and low voltage supplies of an integrated circuit, in which, is realized the differential amplifier. In order to avoid any distortion in the output signal, while taking advantage of the maximum range of signal excursion, it is desirable that the value VCM is centered as precisely as possible on the aforementioned minimum and maximum values.

In order to obtain a well balanced fully differential amplifier that is capable of operating satisfactorily at high frequencies, various authors, for example K. Nakamura et al., IEEE Journal of Solid-State Circuits, Volume 27, No. 4, April 1992, pages 563–567, have proposed the use of structures such as that illustrated in FIG. 2. These structures, called fully differential folded-cascode amplifiers or fully differential level translator amplifiers, comprise a differential input pair 10, that has differential inputs and outputs, followed by two cross-coupled single ended output differential amplifiers 11 and 12. The characteristics of the output voltages Vo1 and Vo2 as a function of the differential input voltage (Vi1–Vi2) should ideally be such as that illustrated in FIG. 3A, that is to say, that the common mode voltage VCM is perfectly centered at the middle values VCM0 of the extreme values of the voltages Vo1 and Vo2. In fact, it should be noted that in practice the characteristic obtained is rather of the type of that of FIG. 3B, that is, when the difference between the input voltages is zero, the common mode voltage, that is to say the crossover point of the voltage curves of Vo1 and Vo2, instead of being equal to the value VCM0; that is centered at the middle values of the extreme values of the voltages Vo1 and Vo2, it is equal to a value VCM1. It is often found that the value of VCM1 may be up to 20% of the difference between the extreme values of the voltages Vo1 and Vo2.

As illustrated in FIG. 2, in order to overcome this inconvenience, it is proposed in the prior art to detect the value of the common mode voltage VCM by means of a resistive bridge, or equivalent, and to inject the offset value of VCM in the feedback loop so as to correct the functionality of the differential input pair 10.

An example of such a representation is described in an article by M. Banu et al., IEEE Journal of Solid-State Circuits, Volume 23, No. 6, December 1988, pages 1410–1414. However, this method presents the inconvenience of creating an additional loop in the circuit which is all the more critical than the gain-bandwidth product of the amplifier, that is to say the frequency of operation of the amplifier is raised since the common mode loop must have a bandwidth as large as the differential mode loop in order to preserve the global value of the gain-bandwidth product.

An object of the present invention is to provide a fully differential amplifier in which the common mode voltage may be adjusted without a feedback loop.

Another object of the present invention is to provide such an amplifier that is a fully differential amplifier wherein the common mode voltage maybe regulated during its fabrication.

SUMMARY OF THE INVENTION

In order to achieve these objects, the present invention provides an amplifier having differential inputs and outputs that comprises: an input differential pair; a first and a second single ended output differential amplifier that each receive the outputs of the differential pair; a buffer stage connected to each single ended output differential amplifier whose output constitutes an output of the amplifier; a unique means for adjusting the quiescent current supplied by the single ended differential amplifiers to the buffer stages that results in the adjustment of the common mode voltage to a required value.

According to a mode of realizing the present invention, each single ended output differential amplifier includes a first and a second path of a pair of common-base transistors, said paths being coupled by a current mirror, the output of the first path constitutes an input to a buffer, and the portion of the current mirror associated with the second path includes an adjustable resistor that is common to each of the second paths of the current mirrors of the single ended output differential amplifiers.

According to a mode of realizing the present invention, the input differential pair includes first and second NPN transistors whose respective collectors are connected to a high, positive, voltage supply via respective load resistors, whose base terminals receive the differential inputs and whose emitters are each connected to a low, negative, voltage supply via a current source; each single ended output differential voltage amplifier includes a pair of common-base transistors constituted by third and fourth PNP transistors whose respective emitters are connected to the respective collectors of the first and second transistors, whose base terminals are each connected to a reference voltage and whose collectors are respectively connected to an input and an output of a current mirror, the collector of the transistor of the first path of the differential pair constitutes the output that is connected to the buffer; and each current mirror includes a fifth and a sixth NPN transistor whose respective collectors are connected to the respective collectors of the third and fourth transistors, whose respective emitters are connected to the low voltage supply via respective first and second resistors, and whose base terminals are connected together and to the collector of the transistor of said second path, the resistor of the second path of the current mirror being common to the first and second single ended output differential amplifiers and constituting said adjustable resistor.

According to other modes of realizing the present invention, the amplifier includes resistors for determining the gain of the amplifier and at least one adjustable or regulating resistor, these resistors are formed as part of the integrated circuit that contains said amplifier. According to a mode of realizing the present invention, the adjustable, or regulating, resistor is a resistor that is adjustable by a fusing method and/or by a laser trimming method.

An advantage of such a structure resides in the fact that if the common mode voltage is adequately centralised, it becomes possible to directly couple in series, without decoupling capacitors, a succession of amplifiers which have moderate gains in order to obtain an amplifier system that has a high gain. This is particularly advantageous because decoupling capacitors are not feasible to integrate since they require an unreasonable amount of surface area on an integrated circuit.

BRIEF DESCRIPTION OF THE DRAWINGS

These objects, features and advantages, and others, of the present invention will be explained in detail in the following description of the particular embodiments, which are intended to be non-limiting with relation to the attached figures amongst which:

FIG. 1 is a schematic diagram of an amplifier that has differential inputs and outputs according to the prior art;

FIG. 2 is a schematic diagram of a fully differential folded-cascode amplifier according to the prior art;

FIG. 3A is a diagram of ideal voltage characteristics of the amplifier of FIG. 1;

FIG. 3B is a diagram, in practice, of voltage characteristics of the amplifier of FIG. 1;

DETAILED DESCRIPTION

Figure 4:
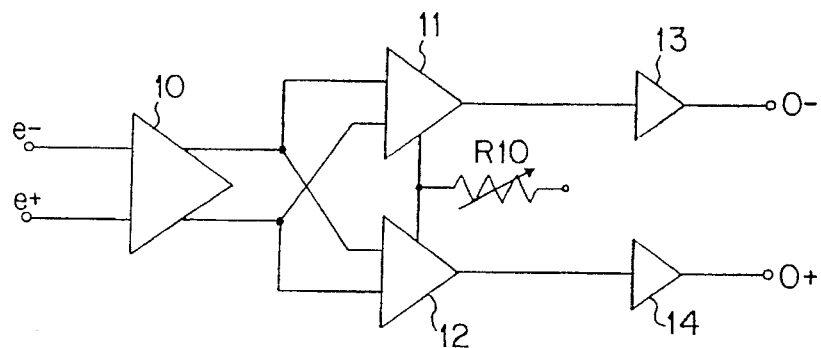
FIG. 4 represents a schematic, in the form of block diagrams, of a fully differential amplifier according to the present invention.

As illustrated in FIG. 4, the present invention utilizes the schematic of a fully differential folded-cascoded amplifier such as illustrated in FIG. 2. Furthermore, the respective outputs of each of the single ended output differential amplifiers 11 and 12 are connected to the respective final outputs o− and o+ of the amplifier via respective intermediate buffers 13 and 14. These buffers are of the known emitter-follower type that have unity gain and thus allow a determined output impedance, that preferably should have a low value so that the buffer can supply sufficient current.

Furthermore, the single ended output differential amplifiers 11 and 12 are designed such that their quiescent currents are controllable. The quiescent current is intended to mean the continuous current supplied by the single ended output differential amplifiers when the input voltages on terminals e− and e+ are identical. More particularly, the present invention allows the choice of the single ended output differential amplifiers 11 and 12 such that their quiescent currents can be regulated in unison by a single adjustable resistance R10.

Of course, in practice, the differential amplifier will be coupled to a resistance network so as to determine the gain, such as the resistors R1 and R2 of FIG. 1. In a practical implementation, these resistors can also be integrated on to the integrated circuit incorporating the amplifiers 10, 11, 12, 13 and 14.

Similarly, the resistance R10 is included in the integrated circuit and realized in the form of a known adjustable resistance by means of fusing techniques or by means of laser trimming, for example.

Figure 5:
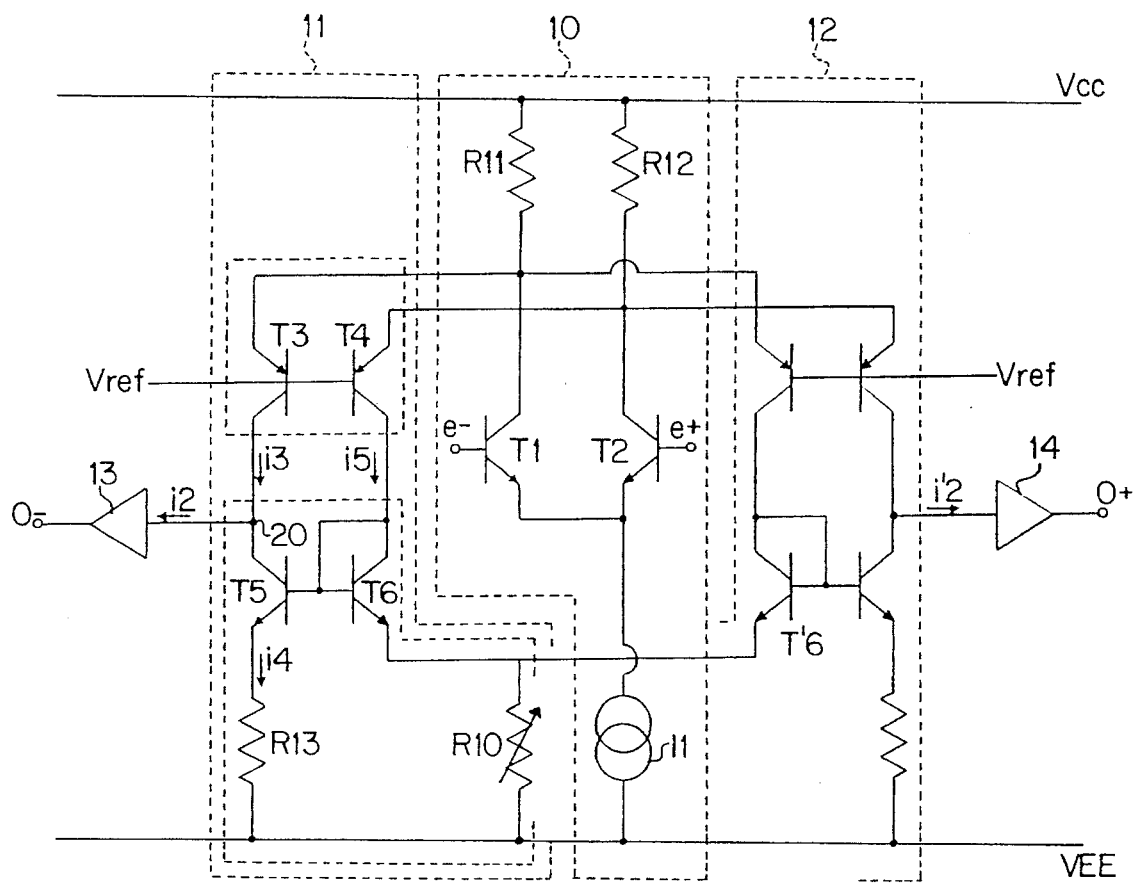
FIG. 5 represents a detailed circuit of an embodiment utilizing bipolar components for the amplifier in accordance with the present invention.

FIG. 5 represents a particular embodiment of the differential amplifier of FIG. 4, which is realized in a bipolar technology.

The differential input pair 10 comprises transistors T1 and T2, of the type NPN, whose collectors are connected, via respective resistors R11 and R12, to a positive voltage supply rail VCC and whose emitters are connected, via a current source I1, to a negative voltage supply rail VEE. The respective base terminals of transistors T1 and T2 correspond to the respective inputs e− and e+.

The single ended output differential amplifiers 11 and 12 are realized such that they are symmetrical and identical. Therefore, only the single ended output differential amplifier 11 will be described.

The single ended output differential amplifier 11 comprises two PNP transistors T3 and T4 connected to form a common-base current amplifier. The base terminals of transistors T3 and T4 are connected to, and biased, by a fixed voltage Vref. The respective emitters of transistors T3 and T4 are connected to the respective collectors of transistors T1 and T2, that is to say to the respective outputs of the differential input pair 10. The respective collectors of transistors T3 and T4 are connected to the respective collectors of transistors T5 and T6, which are of the type NPN and which are connected so as to form a current mirror. The base terminals of transistors T5 and T6 are connected together and to the collector of transistor T6. The emitter of transistor T5 is connected to the negative supply rail VEE via a resistance R13 and the emitter of transistor T6 is connected to the negative supply rail VEE via the resistance R10 that has already been mentioned in relation to FIG. 4.

It should be noted that the resistance R10, connected to the emitter of transistor T6, is also connected to the emitter of the corresponding transistor T'6 of the single ended output differential amplifier 12. Transistors T5 and T6 combine, as mentioned earlier, to form a current mirror, the current flowing through transistor T5 is linked to the current flowing through resistance R10, given by the ratio of the values of resistors R13 and R10 (assuming that transistors T5 and T6 are identical).

Designated by the reference 20 is the common node of the collectors of transistors T3 and T5, which are connected to the input of buffer 13. When the voltages present on the inputs e− and e+ are equal, the voltage at node 20 is referred to as the quiescent voltage. Therefore, the voltage at the output o− of buffer 13 corresponds to the common mode voltage. Since buffer 13 is a unity gain buffer with a predetermined input impedance, the voltage at its output o− will be the same as the voltage at node 20 and will be equal to the product of the current i2 injected into buffer 13 and the input impedance of this buffer.

Designated by i3 is the current flowing through the collector of transistor T3, i4 designates the current flowing through the emitter of transistor T5 and i5 designates the current flowing through the collector of transistor T4. The currents i3 and i5, respectively flowing through transistors T3 and T4, are both approximately constant, predetermined, values since the voltage Vref applied to their base terminals is fixed. As a consequence, if the value of the resistance R10 is adjusted, this has the effect of modifying the base-emitter voltage of transistor T6, while the current i5 remains fixed. Since, as stated above, transistors T5 and T6 are connected to form a current mirror, the base-emitter voltage of transistor T5 will be modified, which in turn regulates the value of current i4. Since the current i3, which is fixed, is equal to the sum of the currents i2 and i4, any change in the current i4 will produce a corresponding change in the current i2. In particular, if i4 increases, i2 decreases and vice-versa.

As a consequence, by simply adjusting or regulating the value of the resistance R10, the current i2 at the output of the single ended output differential amplifier 11 will be adjusted. Thus, an adjustment of the current i2 will result in an adjustment of the common mode voltage of the system.

Figure 6:
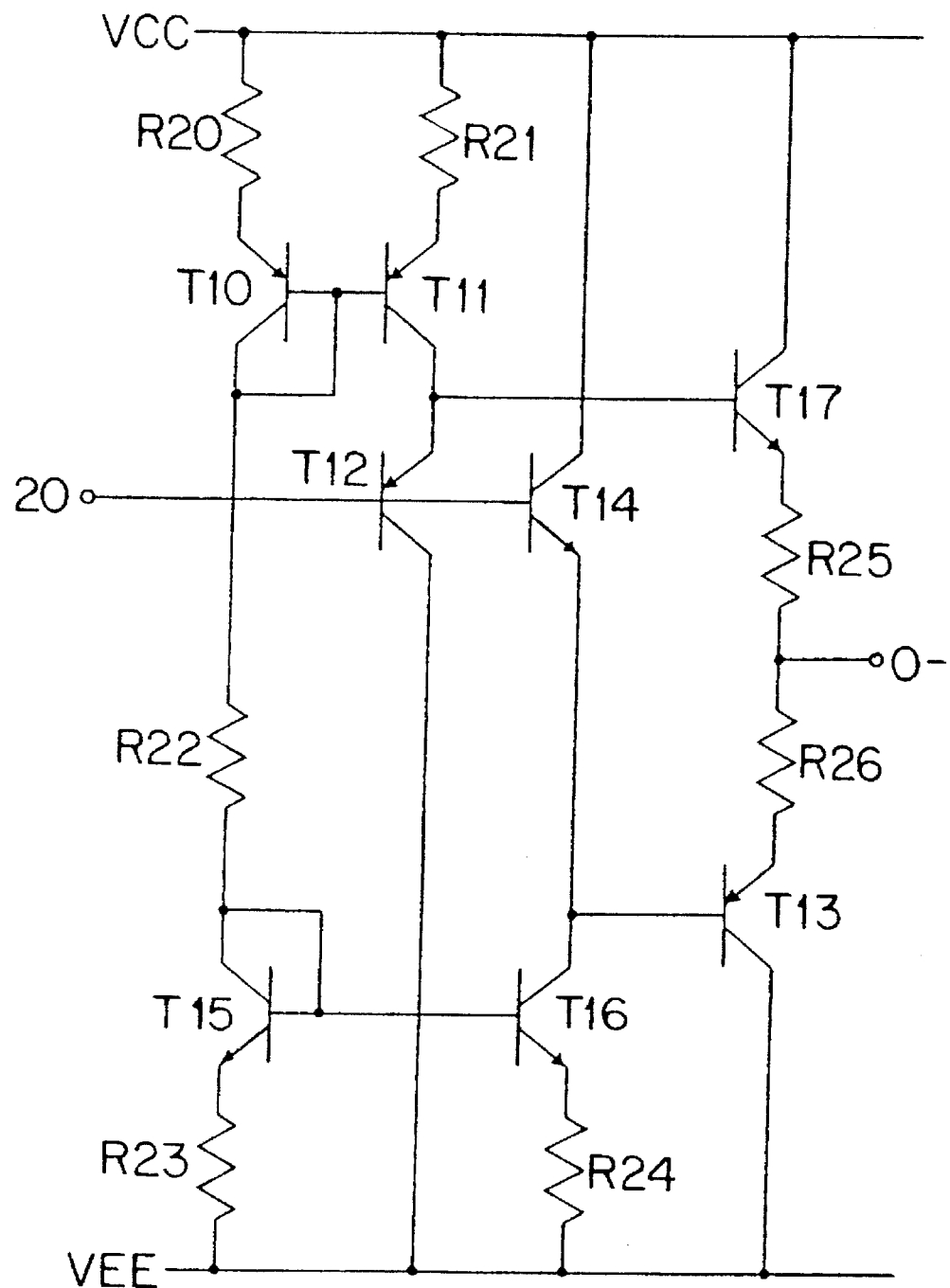
FIG. 6 represents an embodiment of an output buffer of an amplifier in accordance with the present invention.

FIG. 6 illustrates a detailed circuit diagram of a typical unity gain buffer stage 13. Buffer 14 will be identical to buffer 13. Each buffer includes four PNP type transistors T10, T11, T12 and T13; four NPN transistors T14, T15, T16 and T17; and seven resistors R20, R21, R22, R23, R24, R25 and R26.

The respective emitters of transistors T10 and T11 are connected to the positive supply rail VCC via the respective resistors R20 and R21 and their base terminals are connected together. The base terminal of transistor T10 is also connected to its collector terminal.

The respective emitters of transistors T15 and T16 are connected to the negative supply rail VEE via the respective resistors R23 and R24 and their base terminals are connected together. The base terminal of transistor T15 is also connected to its collector terminal. The collector terminals of transistors T10 and T15 are connected together via the resistance R22.

The collectors of transistors T11 and T16 are respectively connected to the emitters of transistors T12 and T14, whose respective collectors are connected to the negative and positive supply rails, respectively VEE and VCC. The base terminals of transistors T12 and T14 are connected together and form the input terminal 20 of the buffer.

The collectors of transistors T17 and T13 are respectively connected to the positive and negative supply rails, respectively VCC and VEE, and their respective emitters are connected together via resistors R25 and R26. The common connection between resistors R25 and R26 forms the output terminal o− of the buffer. The base of transistor T17 is connected to the collector of transistor T11, while the base of transistor T13 is connected to the collector of transistor T16.

Transistors T17 and T13 act as a Class-B output stage and the resistors R25 and R26 contribute to the compensation of inductive effects that are present when working at high frequency.

Referring back to FIG. 5, this represents a differential amplifier having output terminals o− and o+ on which appear the output voltages Vo1 and Vo2. The differential output voltage is Vod=Vo1−Vo2. The output common mode voltage is given by VCM=½(Vo1+Vo2). The output voltages Vo1 and Vo2 vary in opposition due to the differential stage and the two identical single ended output differential amplifier stages 11 and 12. Therefore, for a differential input voltage Vid and a resistive ratio A=R2/R1, Vo1=VCM−A.Vid and Vo2=VCM+A.Vid. The level of the output common mode voltage VCM must be established and regulated to prevent output saturation and the best results are obtained when VCM is zero. In such a case, Vo1=−Vo2=−A.Vid and the output voltage swing is the widest possible. Furthermore, the linearity of the output signal is the best possible.

The fact of providing an adjustable resistance R10, according to the present invention, at a point in the circuitry, indirectly connected to both outputs, that is not sensitive from a dynamic point of view gives an important advantage.

The inventor found that, in the case of a numerical example given below, the precision required for the resistor R10 is approximately 10% per 100 mV of common mode output voltage, thus indicating an extremely simple method of adjusting the output common mode voltage VCM without any degradation of other characteristics of the amplifier.

For the circuit illustrated in FIG. 5, the inventor carried out simulations under the following conditions:

1.2 micrometer, N-Well, self-aligned, double metal, double polysilicon BiCMOS process;

supply voltage=+/−2.5V;

R1=R'1=25 Ohms;

R2=R'2= 500 Ohms; and

100 Ohm load to ground at each output;
and the following principal results were obtained:

| | |
|---|---|
| Current consumption | 16 mA; |
| Closed loop gain (Single Ended) | 20 dB; |
| Gain Bandwidth Product (Single-ended) | 600 MHz; |
| Phase margin (Single-ended) | 461°; |
| Closed loop gain (Differential) | 26 dB; |
| Gain Bandwidth Product (Differential) | 1.2 GHz; |
| Common mode input voltage range | +/−1.25V; and |
| Common mode output voltage range | +/−1.25V. |

Of course, the present invention is susceptible to numerous variations and modifications that will be apparent to one skilled in the art. In particular, the illustrated example has been shown to be implemented in bipolar components. Another similar example of an implementation of the invention can be realized by using MOS transistors or by a combination of MOS and bipolar transistors. An important aspect of the invention resides in the implementation of the single ended output differential amplifiers that include a differential common-base input pair whose paths are associated with the inputs and outputs of current mirrors that have a common path that includes a common adjustable resistance.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An amplifier having differential inputs and differential outputs that comprises:

an input differential pair having a pair of outputs;

first and second single ended output differential amplifiers, each receiving the pair of outputs of the input differential pair;

buffer stages connected to each of the single ended output differential amplifiers, each buffer stage having an output that constitutes the differential outputs of the amplifier; and a means for adjusting a quiescent current supplied by the first and second single ended differential amplifiers to the buffer stages that results in the adjustment of a common mode voltage to a required value.

2. An amplifier having differential inputs and outputs that comprises:

an input differential pair;

a first and second single ended output differential amplifier that each receive the outputs of the differential pair;

a buffer stage connected to each single ended output differential amplifier whose output constitutes an output of the amplifier;

a means for adjusting a quiescent current supplied by the ended differential amplifiers to the buffer stages that results in the adjustment of a common mode voltage to a required value; and wherein each single ended output differential amplifier includes a first and a second path of a pair of common-base transistors, said paths being coupled by a current mirror, the output of the first path constitutes an input to a buffer, and wherein the portion of the current mirror associated with the second path includes an adjustable resistor that is common to each of the second paths of the current mirrors of the single ended output differential amplifiers.

3. An amplifier according to claim 2, wherein:

the input differential pair includes first and second NPN transistors whose respective collectors are connected to a high voltage supply via respective load resistors, whose base terminals receive the differential inputs and whose emitters are each connected to a low voltage supply via a current source;

each single ended output differential voltage amplifier includes a pair of common-base transistors constituted by third and fourth PNP transistors whose respective emitters are connected to the respective collectors of the first and second transistors, whose base terminals are each connected to a reference voltage and whose collectors are respectively connected to an input and an output of a current mirror, the collector of the transistor of the first path of the differential pair constitutes the output that is connected to the buffer; and each current mirror includes a fifth and a sixth NPN transistor whose respective collectors are connected to the respective collectors of the third and fourth transistors, whose respective emitters are connected to the low voltage supply via respective first and second resistors, and whose base terminals are connected together and to the collector of the transistor of said second path, the resistor of the second path of the current mirror being common to the first and second single ended output differential amplifiers and constituting said adjustable resistor.

4. An amplifier according to claim 2, wherein said adjustable resistor is an adjustable resistor that is formed as part of the integrated circuit that contains said amplifier.

5. An amplifier according to claim 1, wherein the amplifier includes resistors for determining the gain of the amplifier, and wherein said resistors are formed as part of the integrated circuit that contains said amplifier.

6. An amplifier according to claim 4, wherein said adjustable resistor is a resistor that is adjustable by a fusing method.

7. An amplifier according to claim 4, wherein said adjustable resistor is a resistor that is adjustable by a laser trimming method.

8. An amplifier having differential inputs and differential outputs, comprising:

a differential amplifier having a pair of inputs and a pair of outputs;

a first single ended output differential amplifier having first and second inputs and an output, the first and second inputs being electrically coupled to a respective one of the pair of outputs of the differential amplifier;

a second single ended output differential amplifier having first and second inputs and an output, the first and second inputs being electrically coupled to a respective one of the pair of outputs of the differential amplifier;

a first buffer having an input electrically coupled to the output of the first single ended output differential amplifier, and having an output that is electrically coupled to a first of the differential outputs of the amplifier;

a second buffer having an input electrically coupled to the output of the second single ended output differential amplifier, and having an output that is electrically coupled to a second of the differential outputs of the amplifier; and a current control device, electrically coupled to the first and the second single ended output differential amplifiers.

9. The amplifier of claim 8, wherein the first and second single ended output differential amplifiers each include:

first and second paths of a pair of common control terminal transistors, said paths being coupled by a current mirror, an output of the first path forming an input to a buffer, and wherein a portion of the current mirror associated with the second path includes an adjustable resistor that is common to the second paths of the current mirrors of the first and second single ended output differential amplifiers.

10. The amplifier of claim 8, wherein the first and second single ended output differential amplifiers each include:

a current mirror having first and second inputs and first and second outputs, the first output of the current mirror being electrically coupled to a first supply voltage terminal through a first resistor, and the second output of the current mirror being electrically coupled to the first supply voltage terminal through the current control device; and first and second transistors, the first and second transistors each having a base, an emitter, and a collector, wherein the base of the first transistor is connected to the base of the second transistor, the base of the first transistor is electrically coupled to a reference voltage terminal, the emitter of the first and second transistors are electrically coupled to a respective one of the pair of outputs of the differential amplifier, the collector of the first transistor is connected to the first input of the current mirror and to the input of the first buffer, and wherein the collector of the second transistor is connected to the second input of the current mirror.

11. The amplifier of claim 10, wherein the current mirror includes:

third and fourth transistors, the third and fourth transistors each having a base, a collector, and an emitter, wherein the collector of the third transistor is connected to the collector of the first transistor, the collector of the fourth transistor is connected to the collector of the second transistor and to the bases of the third and fourth transistors, the emitter of the third transistor is connected to the first resistor, and wherein the emitter of the fourth transistor is connected to the current control device.

12. The amplifier of claim 11, wherein the current control device includes a resistor.

13. The amplifier of claim 12, wherein a resistance of the resistor is set to a particular value by laser trimming.

14. The amplifier of claim 8, wherein the differential amplifier includes:

first and second transistors each having a first terminal, a second terminal and a control terminal;

a first resistor that is electrically coupled between a first supply voltage terminal and the first terminal of the first transistor;

a second resistor that is electrically coupled between the first supply voltage terminal and the first terminal of the second transistor;

a current source that is electrically coupled between a second supply voltage terminal and the second terminal of the first and second transistors; and wherein the control terminal of the first transistor is electrically coupled to a first of the differential inputs of the amplifier, and control terminal of the second transistor is electrically coupled to a second of the differential inputs of the amplifier.

15. The amplifier of claim 14, wherein the first and second single ended output differential amplifiers each include:

a current mirror having first and second inputs and first and second outputs, the first output of the current mirror being electrically coupled to the second supply voltage terminal through a third resistor, and the second output of the current mirror being electrically coupled to the second supply voltage terminal through the current control device; and third and fourth transistors, the third and fourth transistors each having a base, an emitter, and a collector, wherein the base of the third transistor is connected to the base of the fourth transistor, the base of the third transistor is electrically coupled to a reference voltage terminal, the emitter of the third and fourth transistors are electrically coupled to the first terminal of the first and second transistors of the differential amplifier, the collector of the third transistor is connected to the first input of the current mirror and to the input of the first buffer, and wherein the collector of the fourth transistor is connected to the second input of the current mirror.

16. The amplifier of claim 15, wherein the current mirror includes:

fifth and sixth transistors, the fifth and sixth transistors each having a base, a collector, and an emitter, wherein the collector of the fifth transistor is connected to the collector of the third transistor, the collector of the sixth transistor is connected to the collector of the fourth transistor and to the bases of the fifth and sixth transistors, the emitter of the fifth transistor is connected to the third resistor, and wherein the emitter of the sixth transistor is connected to the current control device.

17. A method of differential amplification comprising the steps of:

receiving first and second signals;

differentially amplifying a difference between the first and second signal to produce a first differential output signal;

differentially amplifying the first differential output signal to produce a pair of single ended output signals each having a quiescent current;

buffering each of the pair of single ended output signals to produce a second differential output signal; and controlling the quiescent current of each of the single ended output signals produced by the step of differentially amplifying the first differential output signal to set a common-mode output voltage of the second differential output signal.

18. The method of claim 17, wherein the step of controlling includes a step of:

providing a resistor that determines the quiescent current in each of the single ended output signals.

19. The method of claim 18, further comprising a step of:

adjusting a value of the resistor using laser trimming to set the common-mode output voltage.

20. The method of claim 18, wherein the step of controlling further includes a step of:

mirroring a current that flows through the resistor to determine the quiescent current.

21. The method of claim 18, wherein the quiescent current of each of the pair of single ended output signals is a difference between an approximately fixed input current and a first output current, the method further comprising:

adjusting a resistance of the resistor to change a variable current that flows through the resistor; and mirroring the current to adjust the first output current, the first output current increasing when the variable current increases, and decreasing when the variable current decreases.

22. The amplifier of claim 1, wherein each single ended output differential amplifier includes:

first and second paths of a pair of common control terminal transistors, said paths being coupled by a current mirror, an output of the first path forming an input to a buffer, and wherein a portion of the current mirror associated with the second path includes an adjustable resistor that is common to each of the second paths of the current mirrors of the single ended output differential amplifiers.

* * * * *

UNITED STATES PATENT AND TRADEMARK OFFICE
CERTIFICATE OF CORRECTION

PATENT NO. : 5,557,238
DATED : September 17, 1996
INVENTOR(S): Juliette Weiss

It is certified that error appears in the above-identified patent and that said Letters Patent is hereby corrected as shown below:

In claim 2, line 4, immediately before "first", delete --a--.

In claim 2, line 5, change "fier" to --fiers--.

In claim 2, line 8, after "amplifier;", insert --and--.

In claim 2, line 10, change "ended differential amplifiers" to --single ended output differential amplifiers--.

In claim 2, line 12, after "value;", delete --and--.

In claim 2, line 14, change "a first and a second" to --a first and second--.

In claim 3, line 8, after "differential", delete --voltage--.

Signed and Sealed this

Fourteenth Day of April, 1998

Attest:

BRUCE LEHMAN

Attesting Officer

Commissioner of Patents and Trademarks